(12) United States Patent
Zhang

(10) Patent No.: US 8,497,716 B2
(45) Date of Patent: Jul. 30, 2013

(54) PHASE LOCKED LOOP WITH PHASE CORRECTION IN THE FEEDBACK LOOP

(75) Inventor: Gang Zhang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 143 days.

(21) Appl. No.: 13/204,448

(22) Filed: Aug. 5, 2011

(65) Prior Publication Data

US 2013/0033293 A1    Feb. 7, 2013

(51) Int. Cl.
*H03L 7/06* (2006.01)

(52) U.S. Cl.
USPC .................................. 327/156; 327/147

(58) Field of Classification Search
USPC .................................. 327/147, 156
See application file for complete search history.

(56) References Cited

U.S. PATENT DOCUMENTS

| 6,359,950 | B2 | 3/2002 | Gossmann et al. | |
|---|---|---|---|---|
| 7,817,768 | B2 | 10/2010 | Beyer et al. | |
| 7,969,251 | B2 * | 6/2011 | Fu et al. | 331/74 |
| 2009/0256601 | A1 * | 10/2009 | Zhang et al. | 327/156 |
| 2011/0032013 | A1 * | 2/2011 | Nelson et al. | 327/156 |
| 2011/0057693 | A1 * | 3/2011 | Huang | 327/156 |
| 2011/0133799 | A1 * | 6/2011 | Dunworth et al. | 327/157 |
| 2012/0025882 | A1 * | 2/2012 | Shanan | 327/157 |
| 2012/0074997 | A1 * | 3/2012 | Kim et al. | 327/157 |
| 2012/0105160 | A1 * | 5/2012 | Fu et al. | 331/34 |
| 2012/0161831 | A1 * | 6/2012 | Ravi et al. | 327/156 |
| 2012/0169387 | A1 * | 7/2012 | Hara | 327/156 |
| 2013/0033293 | A1 * | 2/2013 | Zhang | 327/156 |
| 2013/0076415 | A1 * | 3/2013 | Hara et al. | 327/159 |

FOREIGN PATENT DOCUMENTS

WO    2004088846 A1    10/2004

OTHER PUBLICATIONS

International Search Report and Written Opinion—PCT/US2012/049226—ISA/EPO—Nov. 5, 2012.
Zanuso, M. et al., "A 3MHz-BW 3.6GHz Digital Fractional-N PLL With Sub-Gate-Delay TDC, Phase-Interpolation Divider, and Digital Mismatch Cancellation," Dig. technical papers, IEEE Solid-State Circuits Conference (ISSCC), Session 26, pp. 476- 478, Feb. 10, 2010.

* cited by examiner

*Primary Examiner* — Adam Houston
(74) *Attorney, Agent, or Firm* — Kenyon S. Jenckes

(57) ABSTRACT

A frequency synthesizer circuit is disclosed. The frequency synthesizer circuit includes a comparator circuit coupled to a reference clock and a phase-corrected output signal. The frequency synthesizer circuit also includes a loop filter coupled to the comparator circuit. The frequency synthesizer circuit also includes an oscillator coupled to the loop filter. The frequency synthesizer circuit also includes a fractional divider coupled to an output of the oscillator. The frequency synthesizer circuit also includes phase correction circuitry that corrects a phase of an output of the fractional divider to produce the phase-corrected output signal.

34 Claims, 12 Drawing Sheets

PHASE LOCKED LOOP WITH PHASE CORRECTION IN THE FEEDBACK LOOP

TECHNICAL FIELD

The present disclosure relates generally to communication systems. More specifically, the present disclosure relates to a phase locked loop with phase correction in the feedback loop.

BACKGROUND

Electronic devices (cellular telephones, wireless modems, computers, digital music players, Global Positioning System units, Personal Digital Assistants, gaming devices, etc.) have become a part of everyday life. Small computing devices are now placed in everything from automobiles to housing locks. The complexity of electronic devices has increased dramatically in the last few years. For example, many electronic devices have one or more processors that help control the device, as well as a number of digital circuits to support the processor and other parts of the device.

Wireless communication systems are widely deployed to provide various types of communication content such as voice, video, data and so on. These systems may be multiple-access systems capable of supporting simultaneous communication of multiple wireless communication devices with one or more base stations.

Mobile devices may include a variety of circuits used during operation. For example, an oscillator may be used to synchronize various circuits across a board or integrated circuit within a mobile device. Furthermore, different circuits within a mobile device may operate using different frequencies. Therefore, mobile devices may generate multiple reference signals for different purposes.

Frequency synthesizer circuits use frequency division in feedback configurations. However, this may introduce phase inconsistencies in the circuit. Therefore, benefits may be realized by a phase locked loop with phase correction in the feedback loop.

SUMMARY OF THE INVENTION

A frequency synthesizer circuit is disclosed. The frequency synthesizer circuit includes a comparator circuit coupled to a reference clock and a phase-corrected output signal. The frequency synthesizer circuit also includes a loop filter coupled to the comparator circuit. The frequency synthesizer circuit also includes an oscillator coupled to the loop filter. The frequency synthesizer circuit also includes a fractional divider coupled to an output of the oscillator. The frequency synthesizer circuit also includes phase correction circuitry that corrects a phase of an output of the fractional divider to produce the phase-corrected output signal.

The fractional divider may alternate between dividing an output frequency of the oscillator by a first divide ratio and a second divide ratio. The fractional divider may include a delta sigma modulator that randomizes selection of each divide ratio used by the fractional divider while maintaining a desired time-average ratio between the divide ratios. The comparator may be configured to produce an error signal that indicates a difference in phase of the reference clock and the phase-corrected output signal.

The phase correction circuitry may correct the phase of the output of the fractional divider by delaying the phase of the output of the fractional divider so a phase difference between the reference clock and phase-corrected output signal is stable over time. The phase correction circuitry may include multiple delay elements, each including at least one inverter circuit with an adjustable delay.

The phase correction circuitry may receive one or more control signals from digital delay control circuitry. The digital delay control circuitry may include a first delta sigma modulator that receives a time-average fractional divide ratio and outputs an instantaneous integer divide ratio. The digital delay control circuitry may also include a first accumulator that accumulates the difference between the time-average fractional divide ratio and the instantaneous integer divide ratio to produce an accumulated division ratio error. The digital delay control circuitry may also include a digital multiplier that scales the accumulated division ratio error by a gain normalization factor. The digital delay control circuitry may also include a digital adder that adds an offset to the gain-normalized ratio error. The digital delay control circuitry may also include a second delta sigma modulator that truncates the offset ratio error. The digital delay control circuitry may also include a dynamic element matcher that, based on the truncated ratio error, produces the control signals to alternate delay elements used in the phase correction circuitry. The digital delay control circuitry may also include gain normalization factor calibration circuitry that includes a second accumulator that accumulates a product of the accumulated division ratio error and an output of the comparator circuit to produce the gain normalization factor.

An integrated circuit for correcting the phase error in the feedback loop of a phase locked loop (PLL) is also disclosed. The integrated circuit includes a comparator circuit coupled to a reference clock and a phase-corrected output signal. The integrated circuit also includes a loop filter coupled to the comparator circuit. The integrated circuit also includes an oscillator coupled to the loop filter. The integrated circuit also includes a fractional divider coupled to an output of the oscillator. The integrated circuit also includes phase correction circuitry that corrects a phase of an output of the fractional divider to produce the phase-corrected output signal.

A method for correcting the phase error in the feedback loop of a phase locked loop (PLL) is also disclosed. A phase-corrected output signal is compared with a reference clock to produce an error signal. The error signal is filtered. An oscillator output is created with a frequency based on the filtered error signal. An integer divide ratio is selected to achieve a time-average fractional divide ratio. The frequency of the oscillator output is divided by the selected integer divide ratio. A phase of the divided oscillator output is adjusted to produce the phase-corrected oscillator output.

A frequency synthesizer for correcting the phase error in the feedback loop of a phase locked loop (PLL) is also disclosed. The frequency synthesizer includes means for comparing a phase-corrected output signal with a reference clock to produce an error signal. The frequency synthesizer also includes means for filtering the error signal. The frequency synthesizer also includes means for creating an oscillator output with a frequency based on the filtered error signal. The frequency synthesizer also includes means for selecting an integer divide ratio to achieve a time-average fractional divide ratio. The frequency synthesizer also includes means for dividing the frequency of the oscillator output by the selected integer divide ratio. The frequency synthesizer also includes means for adjusting a phase of the divided oscillator output to produce the phase-corrected oscillator output.

DETAILED DESCRIPTION

A phase locked loop (PLL) may be used to generate oscillating signals that are locked, relative to an input reference clock, in phase, frequency or both. An N-divider may be placed in a feedback path of a PLL to implement a frequency synthesizer that is capable of producing an output with a variety of frequencies. In some configurations, a PLL may use a fractional N-divider to enable finer tuning of the output frequency. Such fractional-N PLLs may use a delta sigma modulator (DSM) to determine instantaneous divide ratios used by the N-divider. The DSM, however, may cause noise at certain offsets from the carrier, i.e., the DSM may cause jitter in the phase of the feedback path signal. Furthermore, the DSM may cause spurs.

Therefore, the present systems and methods may use phase correction in the feedback loop of the PLL, e.g., a digital to time converter at the output of the N-divider. This may reduce delta-sigma noise at the input of a phase comparator circuit (e.g., phase and frequency detector or phase to digital converter) by up to 10×. The phase correction circuitry may be digitally calibrated on-the-fly, e.g., using an accumulated residual error from the DSM.

Figure 1:
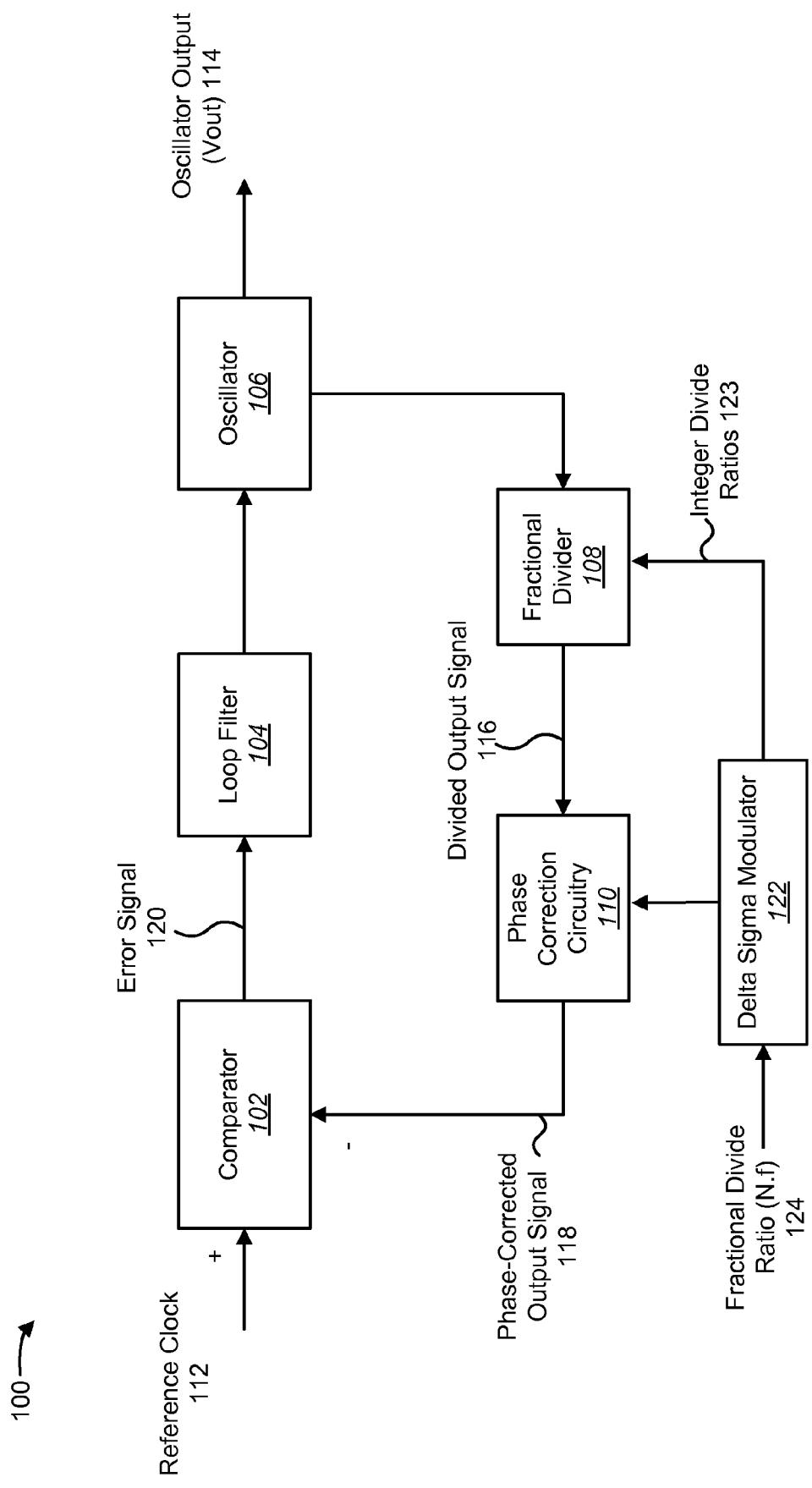
FIG. 1 is a block diagram illustrating a phase locked loop (PLL) using phase correction in the feedback loop.

FIG. 1 is a block diagram illustrating a phase locked loop (PLL) 100 using phase correction in the feedback loop. The PLL 100 may act as a frequency synthesizer. The PLL 100 may include a comparator 102, a loop filter 104, an oscillator 106 and a fractional divider 108 in a feedback configuration. Furthermore, the PLL 100 may include phase correction circuitry 110 that adjusts the phase of the divider 108 output before it is fed to the comparator 102.

In one configuration, the PLL 100 may receive a reference clock 112 with a predetermined frequency (Fref) from a crystal oscillator and/or another suitable signal generator. Using the reference clock 112, the PLL 100 may generate an output signal (Vout) 114 that is fixed (i.e., locked) in frequency and/or phase to the reference clock 112. Optionally, the PLL 100 may also include an r-divider (not shown) that may alter the reference clock 112 prior to comparison at the comparator 102, i.e., an r-divider may divide the frequency of the reference clock 112 before it is received at the comparator 102.

In one configuration, the comparator 102 may compare the reference clock 112 to the output of the feedback loop. Specifically, the fractional divider 108 may divide the oscillator output (Vout) 114 using alternating integer divide ratios 123 to achieve a time-average fractional divide ratio (N.f) 124. The fractional divider 108 may receive the integer divide ratios 123 from a delta sigma modulator (DSM) 122 that randomizes the selection of each integer divide ratio 123 while maintaining a desired time-average fractional divide ratio (N.f) 124. In other words, the time-average of the integer divide ratios 123 may be the fractional divide ratio (N.f) 124. By varying the percentage of time the fractional divider 108 spends using each integer divide ratio 123, the frequency of the oscillator output (Vout) 114 may be selected with relatively high granularity. Therefore, the divided output signal 116 may be a signal with a frequency equal to the frequency of the output signal (Vout) 114 divided by a parameter between N and N+1 where N and N+1 are adjacent integers.

The fractional divider 108 may cause phase jumping in the feedback loop, i.e., alternating between different instantaneous integer divide ratios 123 may cause phase jumping in the divided output signal 116. As used herein, the term "phase error" or "delta phase" refers to the difference between the phase of the divided output signal 116 and the phase of the reference clock 112. This phase error may cause errors in the PLL 100. Therefore, the present systems and methods may include phase correction circuitry 110 that cancels some of this phase error to stabilize the phase difference entering the comparator 102.

An unstable phase error may be a problem. The loop filter 104 may filter some of an unstable phase error, but may not be sufficient when a wide loop filter bandwidth is used. In one configuration, the phase correction circuitry 110 may be a digital delay line that stabilizes the phase error entering the comparator 102, i.e., the phase correction circuitry 110 may produce a phase-corrected output signal 118. A stable phase error may be filtered by the loop filter 104. Alternatively, the phase correction circuitry 110 may eliminate the phase difference.

The comparator 102 may determine any differences in phase and/or frequency between the phase-corrected output signal 118 and the reference clock 112. The comparator 102 may produce an error signal 120 to the loop filter 104 that may filter the error signal 120 and feed it to the oscillator 106. Upon receiving a signal from the loop filter 104, the oscillator 106 may generate an output signal (Vout) 114 having a frequency based on the input signal provided by the loop filter 104. The oscillator output signal (Vout) 114 may be divided and phase-corrected again before it is compared again to the reference clock 112 to facilitate continuous adjustment of the oscillator output signal (Vout) 114 in relation to the reference clock 112.

Figure 2:
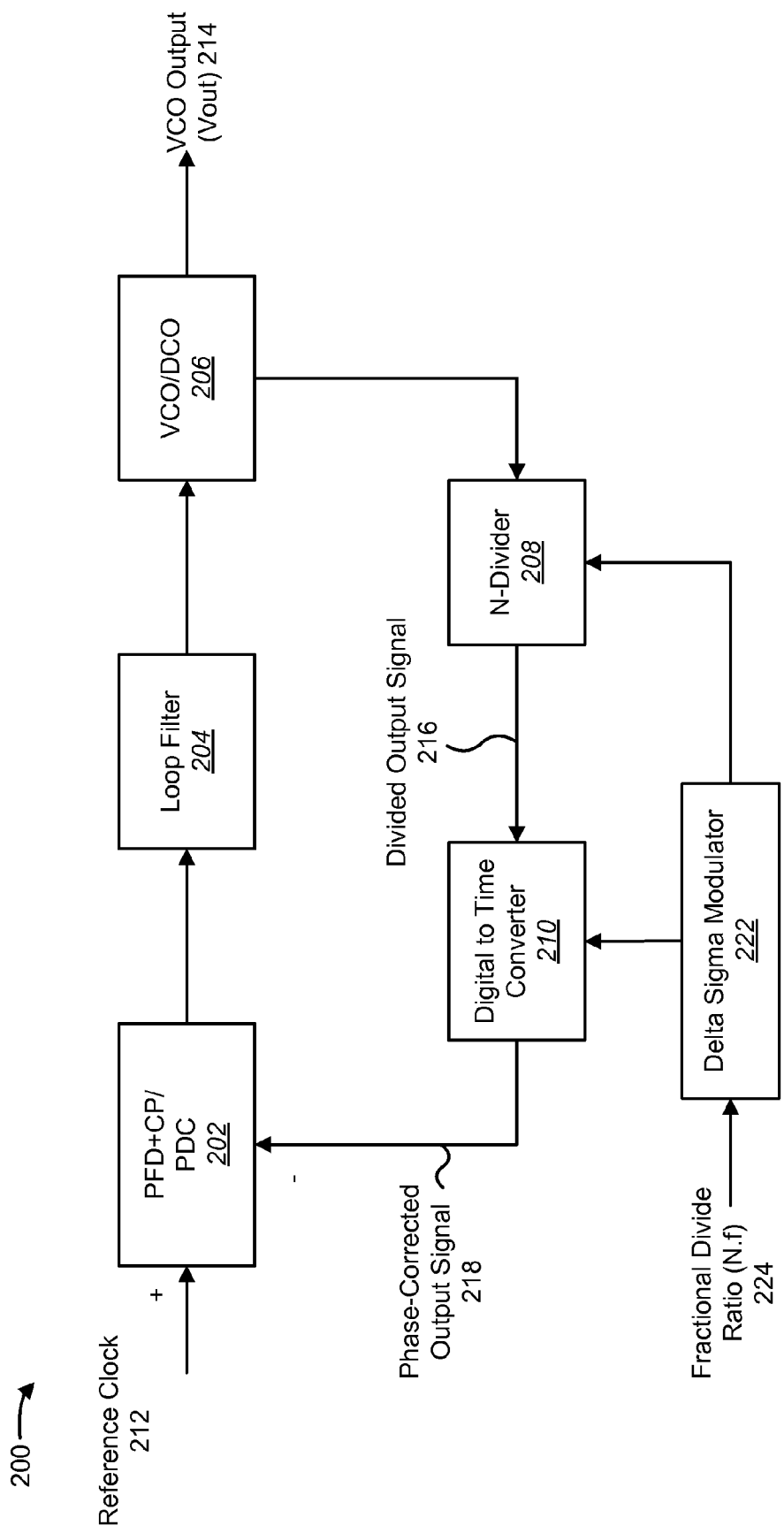
FIG. 2 is a block diagram illustrating another configuration of a phase locked loop (PLL) using phase correction in the feedback loop.

FIG. 2 is a block diagram illustrating another configuration of a phase locked loop (PLL) 200 using phase correction in the feedback loop. The PLL 200 may be an analog PLL or an all-digital PLL (ADPLL). Depending on the type (analog or digital), the PLL 200 may implement the various elements of the PLL 100 illustrated in FIG. 1 differently.

In an analog PLL 200, the comparator 102 may be implemented using a phase and frequency detector (PFD) and a charge pump (CP) 202. The PFD portion may compare the reference clock 212 to the phase-corrected output signal 218 in the feedback loop and express this difference as "pump up" or "pump down" pulses to the charge pump portion. The charge pump portion may then provide charge to an analog loop filter 204 that may filter the output from the charge pump portion. In an analog PLL 200, the loop filter 204 may include one or more resistors and capacitors and the oscillator 106 may be a voltage controlled oscillator (VCO) 206. The VCO 206 may receive the loop filter 204 output at a tuning port and produce a VCO output (Vout) 214 with a frequency (Fvco) based on the voltage at the tuning port.

The analog PLL 200 may be a fractional PLL 200 because the N-divider 208 may be controlled by a delta sigma modulator (DSM) 222. The DSM 222 may switch between two integer values (N, N+1) to achieve a fractional average divide ratio (N.f) 224 over time. In other words, the N-divider 208 may alternate between two different divide ratios to so that the PLL 200 settles at a particular frequency, i.e., by varying the percentage of time the divider 208 spends using each instantaneous integer divide ratio the frequency of the VCO output (Vout) 214 may be selected with relatively high granularity. If Fref is the frequency of the reference clock 212 and N.f is the time-average fractional divide ratio 224, the frequency (Fvco) of the VCO output (Vout) 214 may settle at Fvco=Fref*N.f in the PLL 200. The DSM 222 may randomize the selection of each integer divide factor while maintaining a desired time-average fractional divide ratio (N.f) 224. This may reduce spurious signals in the VCO output (Vout) 214 caused by a periodic switching between two instantaneous integer divide ratios.

So, even though the time-average fractional divide ratio 224 over time is stable at N.f 224, the instantaneous integer divide ratios used by the N-divider 208 may switch frequently. The alternating between different instantaneous integer divide ratios may cause phase jumping in the divided output signal 216. In order to correct the phase of the divided output signal 216, a digital to time converter 210 may receive the divided output signal 216 and output a phase-corrected output signal. Specifically, the digital to time converter 210 may be a digital delay line that stabilizes the phase error to produce a phase-corrected output signal 218. As used herein, the terms "digital to time converter" and "phase correction circuitry" may be used interchangeably.

In contrast to an analog PLL 200, the comparator 102 may be implemented using a phase to digital converter (PDC) 202 in an all-digital PLL 200. The PDC 202 may determine a phase difference between the reference clock 212 and the phase-corrected output signal 218. A digital loop filter 204 may then control a digitally controlled oscillator (DCO) 206 to produce a VCO output (Vout) 214. The N-divider 208, delta-sigma modulator 222 and digital to time converter (DTC) 210 in an ADPLL 200 may operate similarly to the analog PLL 200 discussed above.

In one configuration, the digital to time converter 210 may improve performance of the PLL 200, e.g., 20 dB reduction in DSM noise and PFD/PDC 202 dynamic range. Furthermore, the present systems and methods may be compatible with low Vdd processes and may be implemented in a small area to improve portability.

Figure 3:
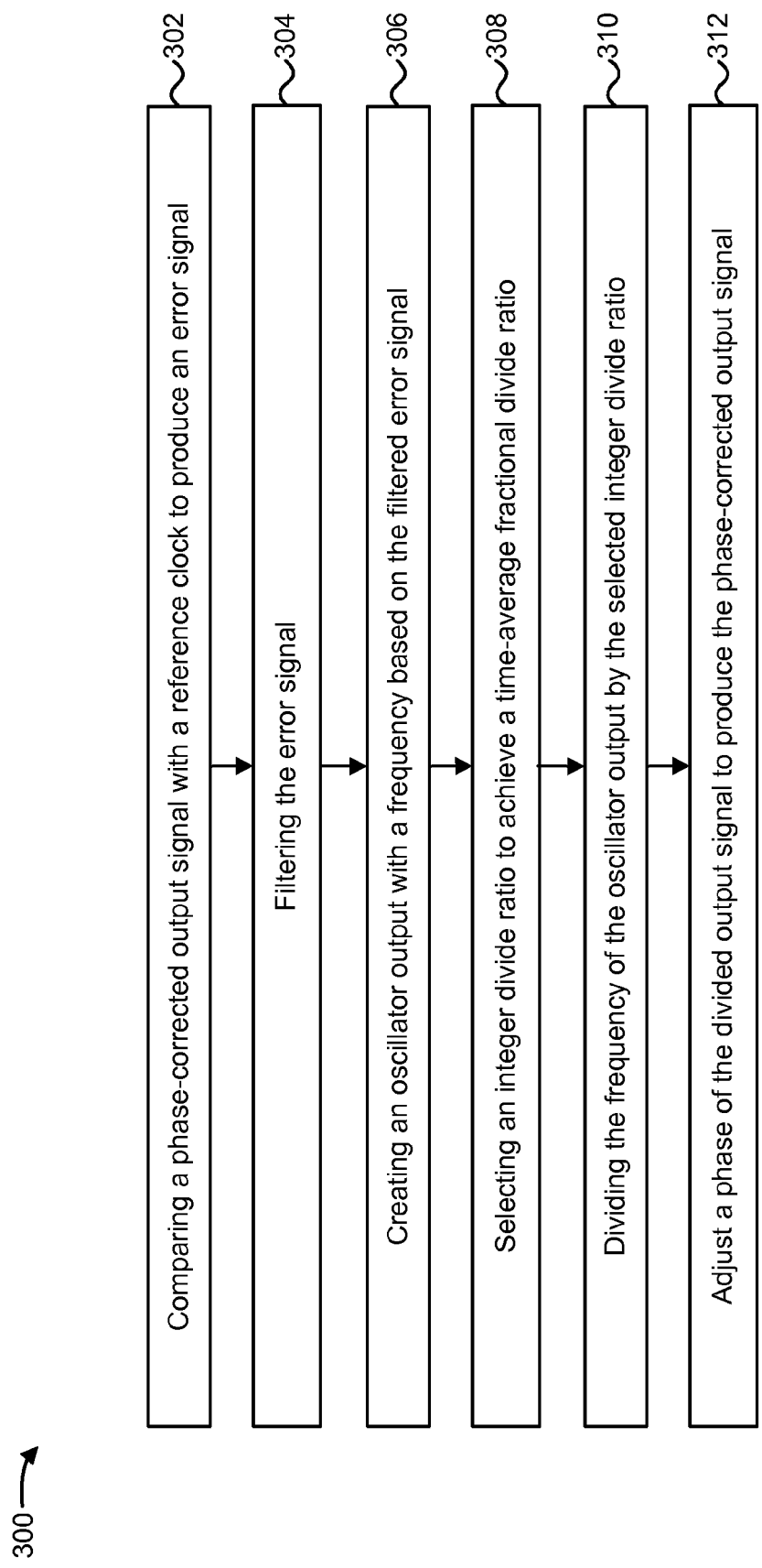
FIG. 3 is a flow diagram illustrating a method for correcting the phase error in the feedback loop of a phase locked loop (PLL)

FIG. 3 is a flow diagram illustrating a method 300 for correcting the phase error in the feedback loop of a phase locked loop (PLL) 100. The method 300 may be performed by various elements of a PLL 100. The PLL 100 may compare 302 a phase-corrected output signal 118 with a reference clock 112 to produce an error signal 120, e.g., a comparator 102 may produce an error signal 120 based on the phase difference between a phase-corrected output signal 118 and a reference clock 112. The PLL 100 may also filter 304 the error signal 120, e.g., a loop filter 104 may filter the error signal 120. The PLL 100 may also create 306 an oscillator output 114 with a frequency based on the filtered error signal 120, e.g., an oscillator (VCO or DCO) 106 may produce an oscillator output (Vout) 114 based on the loop filter 104 output. The PLL 100 may also select 308 an integer divide ratio to achieve a time-average fractional divide ratio, e.g., a delta sigma modulator (DSM) 122 may determine an integer divide ratio for a fractional divider 108 to achieve a fractional divide ratio (N.f) 124. The PLL 100 may also divide 310 the frequency of the oscillator output (Vout) 114 by the selected integer divide ratio, e.g., the fractional divider 108 may perform frequency division to produce a divided output signal 116. The PLL 100 may also adjust 312 a phase of the divided output signal 116 to produce the phase-corrected output signal 118, e.g., phase-correction circuitry 110 may correct the phase of the divided output signal 116 to produce a phase-corrected output signal 118.

Figure 4:
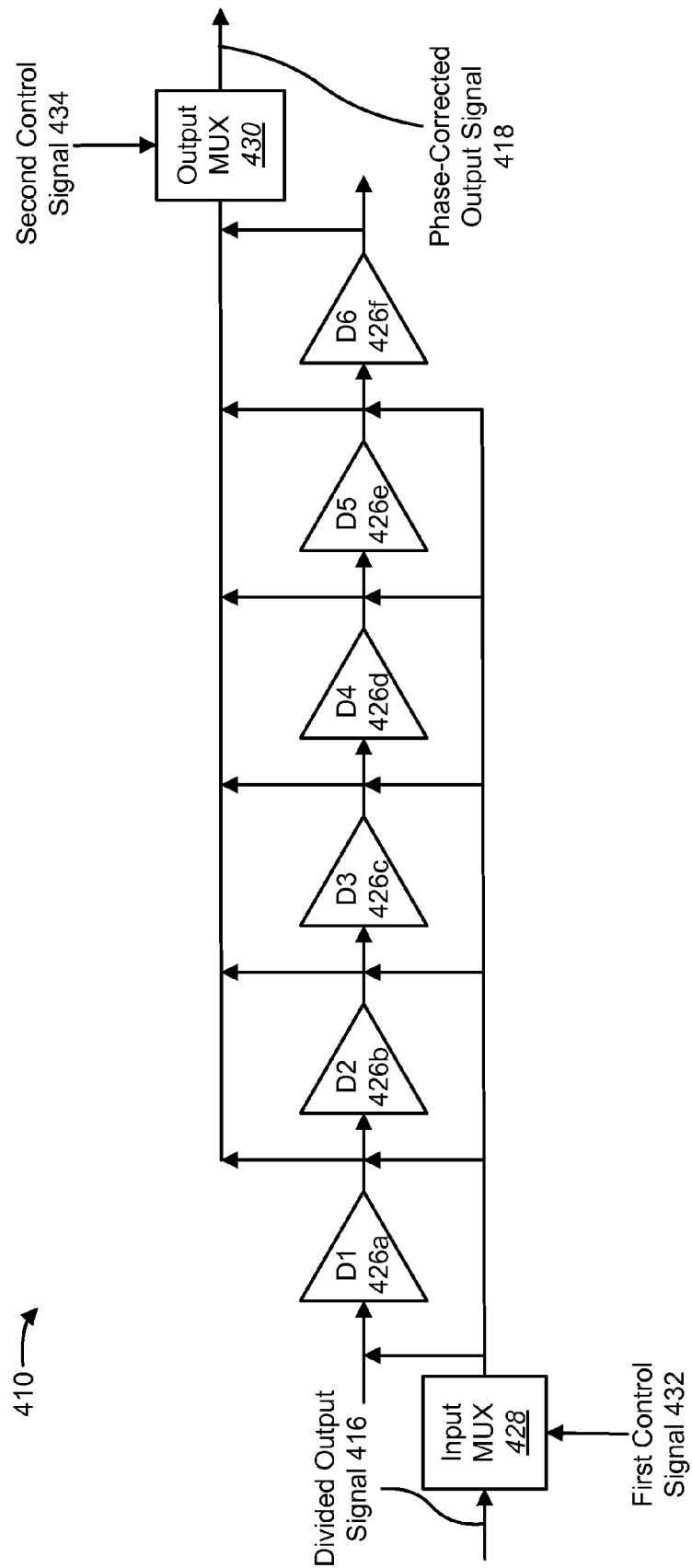
FIG. 4 is a block diagram illustrating phase correction circuitry.

FIG. 4 is a block diagram illustrating phase correction circuitry 410. The phase correction circuitry 410 may include a series of controllable delay elements (D1-D6) 426a-f with a multiplexed input and output. Although illustrated with six delay elements (D1-D6) 426a-f, the phase correction circuitry 410 may include any suitable number of delay elements, e.g., 100 delay elements. The phase correction circuitry 410 may receive a divided output signal 416 from an N-divider (not shown). The divided output signal 416 may have a jumping phase error because the N-divider is alternating between different integer divide ratios to achieve a time-average fractional divide ratio. The phase correction circuitry 410 may dynamically delay the divided output signal to produce a phase-corrected output signal 418 with a stable phase error over time, i.e., in one configuration, the phase correction circuitry 410 may stabilize the phase error rather than eliminating it.

Specifically, the input MUX 428, using the first control signal 432, may determine at which delay element (D1-D6) 426a-f input to feed the divided output signal 416. Similarly, the output MUX 430, using the second control signal 434, may determine at which delay element (D1-D6) 426a-f output to read to produce the phase-corrected output signal. Therefore, in addition to determining how many delay elements (D1-D6) 426a-f are used, the input MUX 428 and output MUX 430 may determine which actual delay elements (D1-D6) 426a-f are used. This may be used to compensate for mismatch in the delay elements (D1-D6) 426a-f, i.e., dynamic element matching (DEM). The first control signal 432 and second control signal 434 may be derived from a delta sigma modulator, such as the delta sigma modulator 222 illustrated in FIG. 2.

Figure 5:
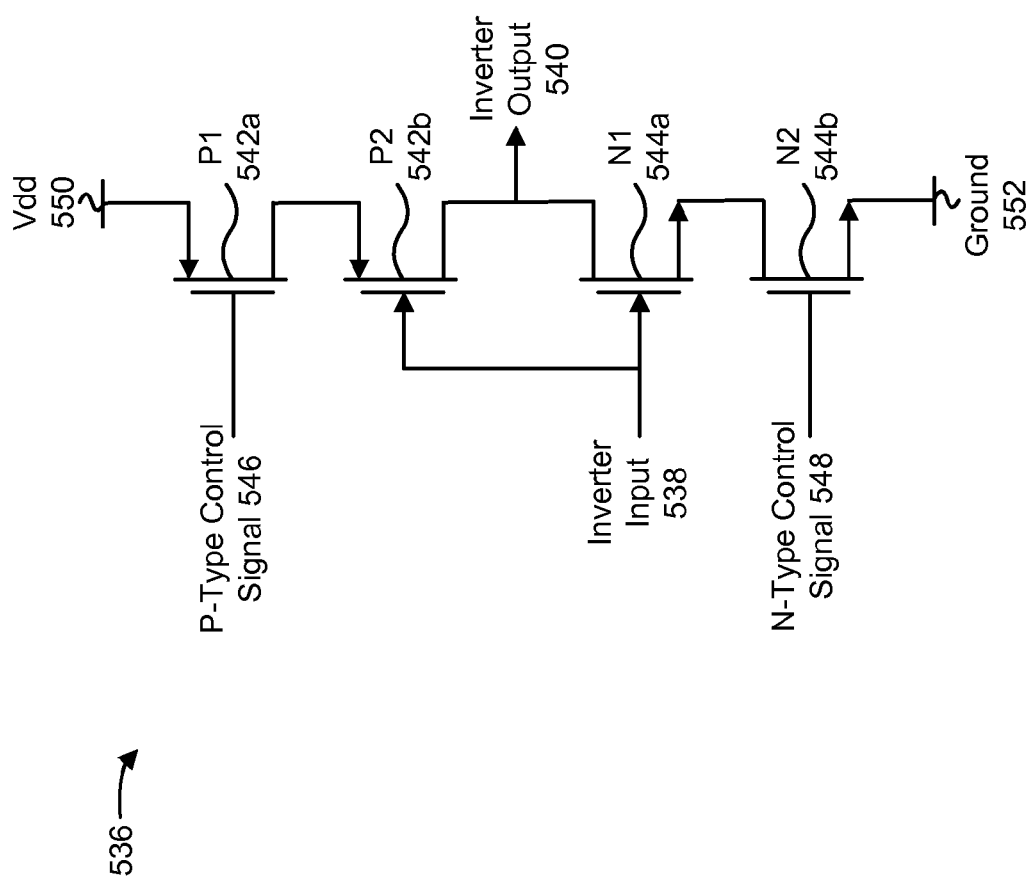
FIG. 5 is a circuit diagram illustrating a possible configuration for an inverter.

FIG. 5 is a circuit diagram illustrating a possible configuration for an inverter 536. The inverter 536 may be a gated inverter, i.e., a tri-state inverter. Therefore, the each delay element (D1-D6) 426a-f in the phase correction circuitry 410 illustrated in FIG. 4, may include one or more inverters 536. For example, each delay element (D1-D6) 426a-f may include two such inverters 536. The inverter 536 may include two P-type field effect transistors (FETs) (P1-P2) 542a-b and two N-type FETs (N1-N2) 544a-b.

The first P-type FET (P1) 542a may couple the second P-type FET (P2) to Vdd 550. Specifically, the source of the first P-type FET (P1) 542a may couple to Vdd 550, the gate may couple to a P-type control signal 546 and the drain may couple to the source of the second P-type FET (P2) 542b. The gates of the second P-type FET (P2) 542b and the first N-type FETs (N1) 544a may couple to each other and the inverter input 538. The drains of the second P-type FET (P2) 542b and the first N-type FETs (N1) 544a may couple to each other and the inverter output 540. The second N-type FET (N2) 544b may couple the first N-type FET (N1) 544a to ground 552.

Specifically, the source of the second N-type FET (N2) 544b may couple to ground 552, the gate may couple to an N-type control signal 548 and the drain may couple to the source of the first N-type FET (N1) 544a. The P-type control signal 546 and N-type control signal 548 may be analog control signals that control the overall delay from the inverter input 538 to the inverter output 540. In one configuration, the control signals 546, 548 may be differential, with a resolution around 30 picoseconds for 65 nanometer channel length. For example, the control signals 546, 548 may be programmable analog direct current (DC) voltages.

Figure 6:
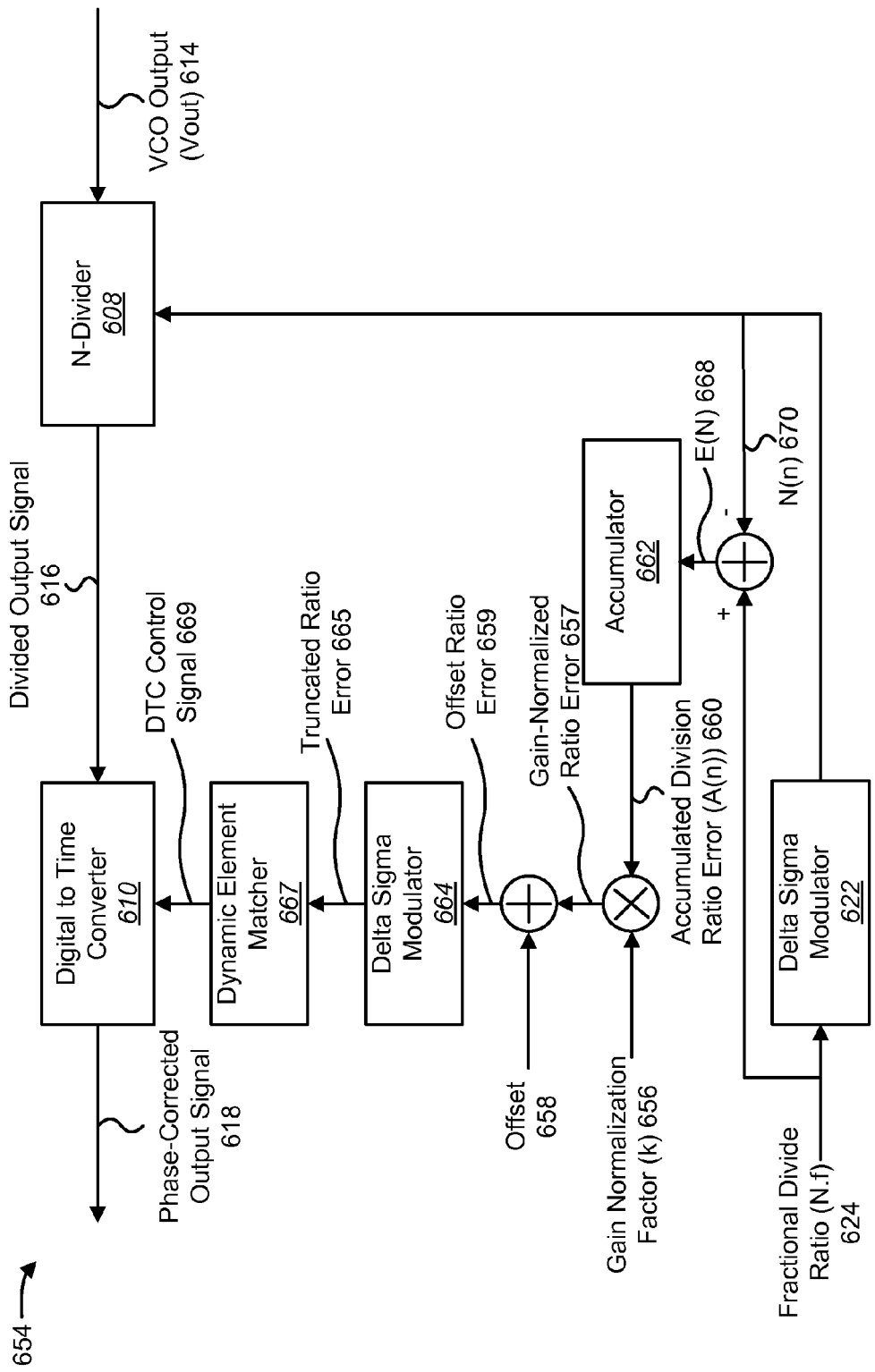
FIG. 6 is a block diagram illustrating a feedback path that performs phase correction in a phase locked loop.

FIG. 6 is a block diagram illustrating a feedback path 654 that performs phase correction in a phase locked loop. In other words, FIG. 6 illustrates how the digital delay control signals (e.g., the first control signal 432 and second control signal 434 illustrated in FIG. 4) for the digital to time converter 610 may be determined. An N-divider 608 in the feedback path 654 may receive the VCO output (Vout) 614 and divide the frequency by the instantaneous integer divide ratio (N(n)) 670 determined by a delta sigma modulator 622 to produce a divided output signal 616. As discussed above, the divided output signal 616 may have a jumping phase due to the alternating instantaneous integer divide ratios (N(n)) 670. Therefore, a digital to time converter 610 may receive the divided output signal 616 and produce a phase-corrected output signal 618 with a stabilized phase error.

A delta sigma modulator 622 may receive a time-average fractional divide ratio (N.f) 624, e.g., as a floating point control word input. The output may be an instantaneous integer divide ratio (N(n)) 670. However, the delta sigma modulator 622 may also provide control signals for the digital to time converter 610, i.e., the digital to time converter 610 may dynamically change the amount of delay to compensate for the phase jumping in the divided output signal 616.

In order to provide control signals for the digital to time converter 610, the difference between the fractional divide ratio (N.f) 624 and the instantaneous divide ratio (N(n)) 670 may be taken. This difference may be the instantaneous divide ratio error (E(n)) 668 and may be accumulated every clock cycle by an accumulator 662 to produce the accumulated division ratio error (A(n)) 660.

The accumulated division ratio error (A(n)) 660 may be scaled by a gain normalization factor (k) 656. The gain normalization factor (k) 656 may account for imprecision in the delay elements in the digital to time converter 610. In other words, analog delay elements may be used in the digital to time converter 610 to compensate for the accumulated division ratio error (A(n)) 660, but the delay imposed by each delay element may be slightly different. Therefore, the gain normalization factor (k) 656 may be dynamically adapted (e.g., every VCO clock cycle) to account for this imprecision. Furthermore, the gain normalization factor (k) 656 may also account for delay element variation across temperatures, process and voltage. The calibration of the gain normalization factor (k) 656 will be discussed below.

The gain-normalized ratio error 657 may be added with an offset 658. Since the digital to time converter 610 may act as a delay line, it can only add more delay, not remove delay, i.e., it cannot subtract phase, only add it. But, the accumulated division ratio error (A(n)) 660 may be negative if the instantaneous divide ratio error (E(n)) 668 is continually negative. Therefore, the offset 658 may bias the gain-normalized ratio error 657 so it is always positive. In other words, the offset 658 ensures that the offset ratio error 659 is positive, i.e., the offset 658 may be inserted to use only one polarity delay data.

A second delta sigma modulator 664 may then truncate the offset ratio error 659. The offset ratio error 659 may be a digital word with a relatively fine resolution, e.g., 12 or 20 bits. However, the digital to time converter 610 may not be capable of such a fine resolution, e.g., it may only have 100 delay elements (six bits of resolution). Therefore, in order to maintain resolution, the second delta sigma modulator 664 may truncate the offset ratio error 659 based on the resolution of the digital to time converter 610, e.g., truncate from 20 bits to six bits. In other words, the second delta sigma modulator 664 may digitally truncate the offset ratio error 659 to produce a truncated ratio error 665 in order to account for the difference in resolution between the offset ratio error 659 and the digital to time converter 610. This may push rounding errors to a high frequency that may be filtered out later.

The dynamic element matcher (DEM) 667 may account for mismatch in delay elements in the digital to time converter 610 using the truncated ratio error 665. For example, suppose that, based on the truncated ratio error 665, two delay units are desired to delay the divided output signal 616 in order to stabilize the accumulated division ratio error (A(n)) 660. If the digital to time converter 610 always used the first two delay elements, it may create a systematic offset because each delay element may not be perfectly matched to every other delay element. Therefore, the dynamic element matcher (DEM) 667 may implement an algorithm to average out the mismatches of the different delay elements. For example, the dynamic element matcher (DEM) 667 may determine a DTC control signal 669 that alternates which two delay elements are used, i.e., barrel shifting. The DEM 667 may allow high linearity because by reducing or eliminating sensitivity to mismatch of inverter/delay element delays.

Figure 7:
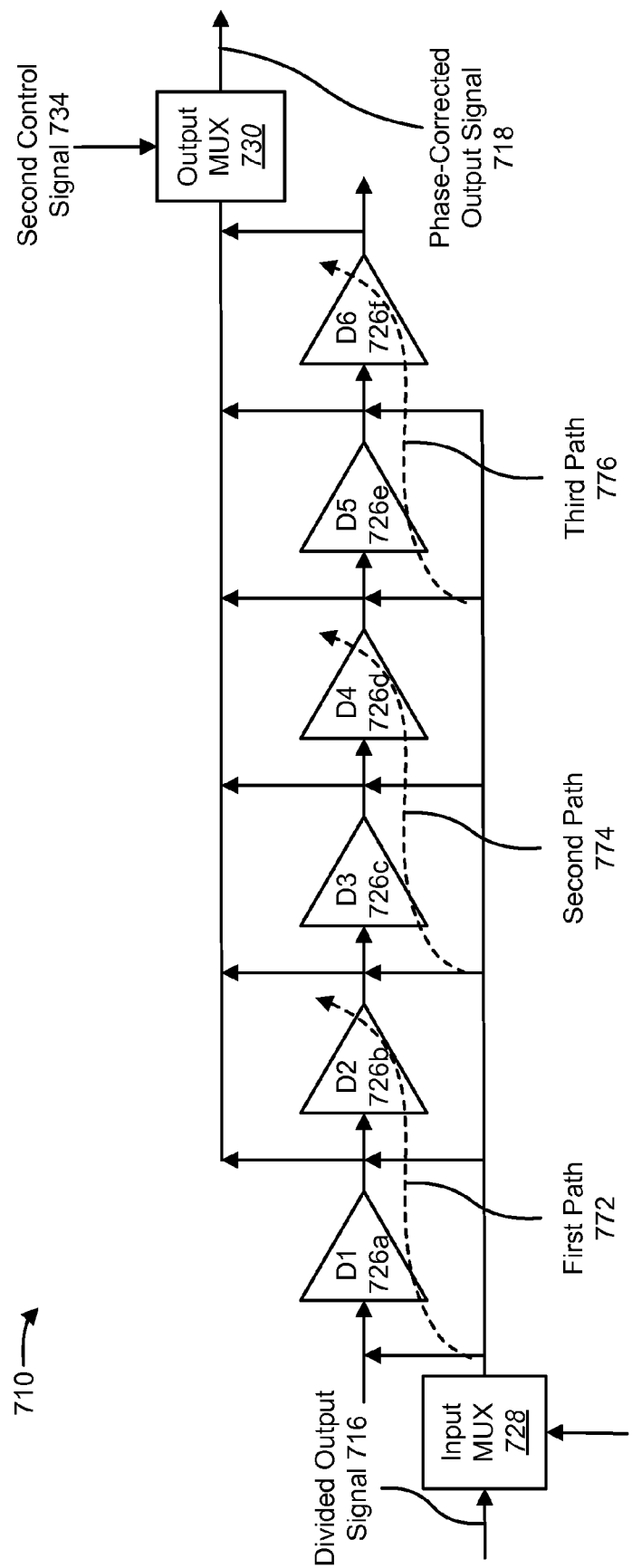
FIG. 7 is a block diagram illustrating dynamic element matching in a digital to time converter.

FIG. 7 is a block diagram illustrating dynamic element matching in a digital to time converter 710. The digital to time converter 710 illustrated in FIG. 7 includes many of the same elements as the digital to time converter 410 illustrated in FIG. 4. Specifically, the input MUX 728, output MUX 730 and delay elements (D1-D6) 726a-f illustrated in FIG. 7 may correspond to and include similar functionality as the input MUX 428, output MUX 430 and delay elements (D1-D6) 426a-f illustrated in FIG. 4. As before, the divided output signal 716 may be received from an N-divider (not shown) and delayed to produce a phase-corrected output signal 718. The first control signal 732 and second control signal 734 may be received from the dynamic element matcher (DEM) 667 illustrated in FIG. 6.

As discussed above, dynamic element matching may be used to compensate for delay element mismatch, i.e., transistors (e.g., as illustrated in the inverter 536 illustrated in FIG. 5) may vary over temperature, process and voltage. Therefore, it may be beneficial to alternate the particular delay elements (D1-D6) 726a-f used. For example, if a delay of two delay elements (D1-D6) 726a-f is repeatedly used, the first control signal 732 and the second control signal 734 may specify a rotation of the first path 772 (i.e., through D1 726a and D2 726b), second path 774 (i.e., through D3 726c and D4 726d) and third path 776 (i.e., through D5 726e and D6 726f). This first order dynamic element matching may be referred to as barrel shifting. This may shape the delay element (D1-D6) 726a-f mismatch error to a high frequency so that it may be filtered out subsequently. High linearity in dynamic element matching may allow spur suppression and phase noise folding.

Figure 8:
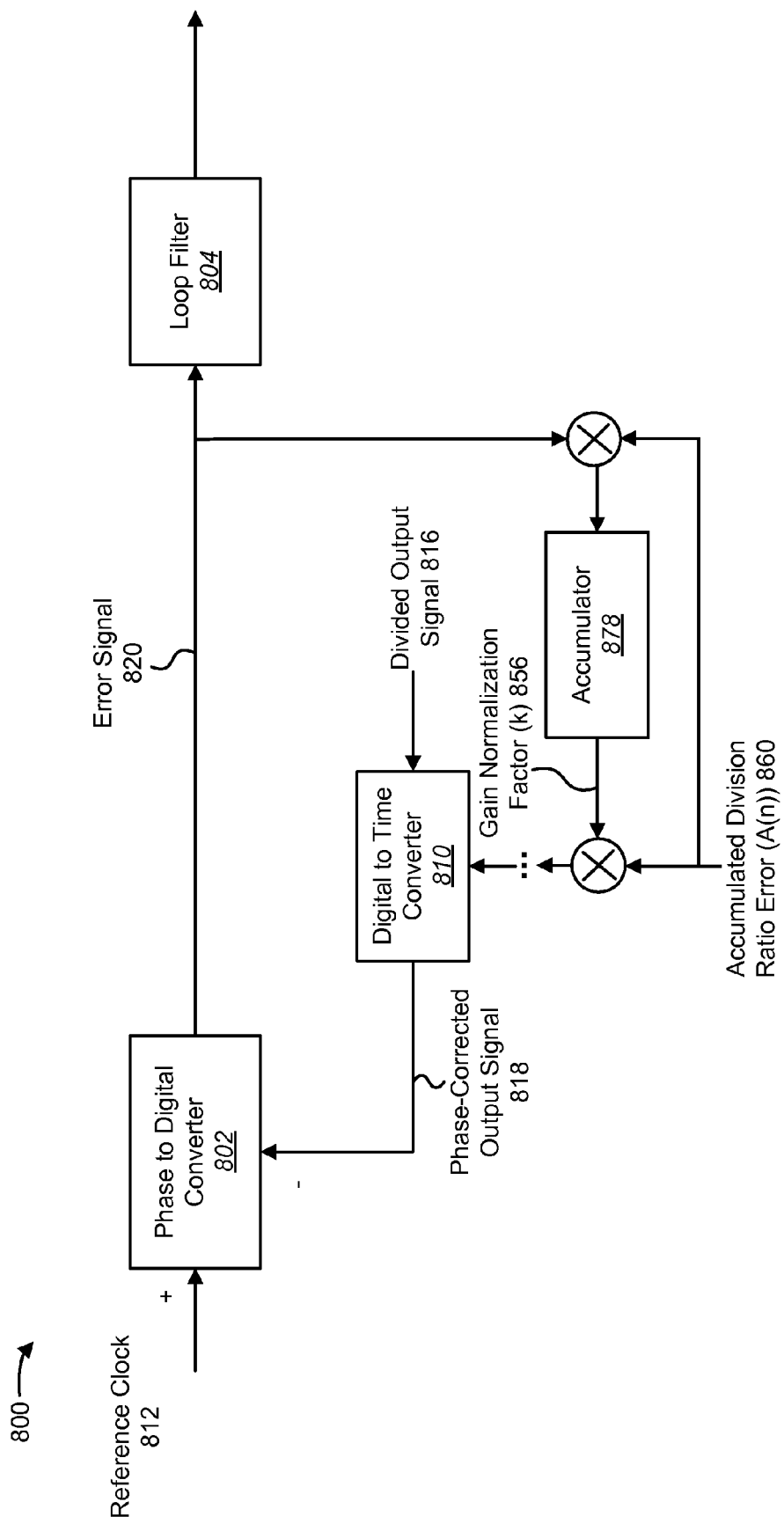
FIG. 8 is a block diagram illustrating digital to time converter calibration in an all-digital phase locked loop (AD-PLL)

FIG. 8 is a block diagram illustrating digital to time converter 810 calibration in an all-digital phase locked loop (ADPLL) 800. Specifically, the ADPLL 800 may use a least mean square (LMS) adaptive algorithm to dynamically calibrate the gain normalization factor (k) 856, i.e., to compensate for pressure, voltage and temperature variations. In other words, the digital to time converter 810 may be calibrated to a time reference, e.g., one VCO period.

In the ADPLL 800, an error signal 820 may be output by a phase to digital converter 802 to a loop filter 804. The error signal 820 may indicate the difference in phase between a reference clock 812 and a phase-corrected output signal 818. As before, the accumulated division ratio error (A(n)) 860 may be the accumulation, or integration, of the error between a time-average fractional divide ratio (N.f) and an instantaneous integer divide ratio (N(n)). The digital error signal 820 may also be multiplied by the digital accumulated division ratio error (A(n)) 860. This product may be accumulated again (e.g., by the accumulator 878) to produce the gain normalization factor (k) 856 that is used to account for imprecision in the delay elements in the digital to time converter 810. When there is a static offset at the phase to digital converter 802 input, there may be a problem for the LMS algorithm. However, the illustrated LMS algorithm may prevent an unbounded gain normalization factor (k) 856, i.e., this configuration may ensure that the average input to the accumulator is zero.

The digital to time converter 810 may delay the divided output signal 816 to produce a phase-corrected output signal 818. Although not shown, the ADPLL 800 may include the other feedback path elements illustrated in FIG. 6, i.e., two delta sigma modulators 622, 664, another accumulator 662, the dynamic element matcher 667, digital adders, etc. The present systems and methods may calibrate/normalize on-the-fly and may not require tunable delay lines.

Figure 9:
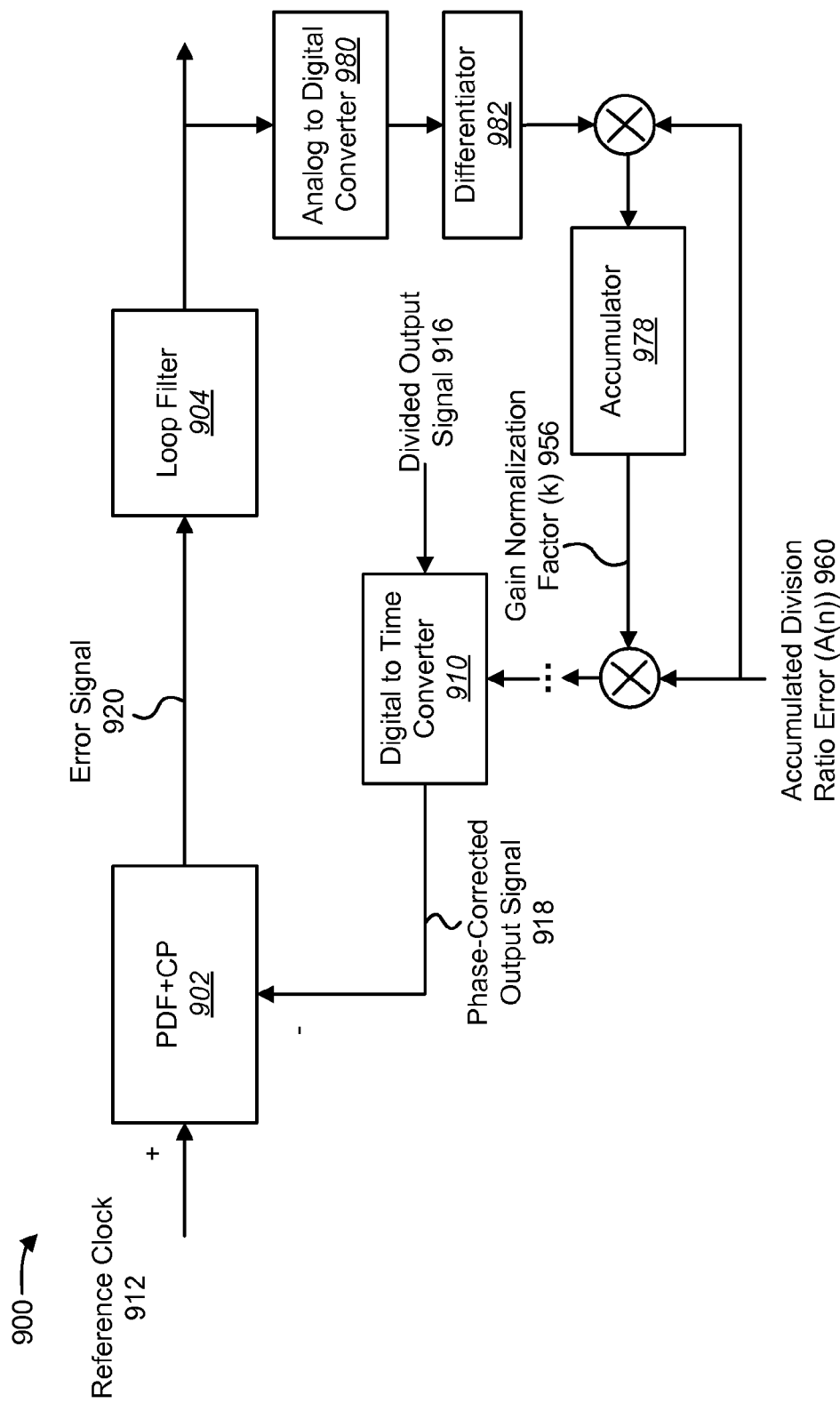
FIG. 9 is a block diagram illustrating one configuration of digital to time converter calibration in an analog locked loop (PLL)

FIG. 9 is a block diagram illustrating one configuration of digital to time converter 910 calibration in an analog locked loop (PLL) 900. Similar to the ADPLL 800 illustrated in FIG. 8, the PLL 900 may use a least mean square (LMS) adaptive algorithm to dynamically calibrate the gain normalization factor (k) 956, i.e., to compensate for pressure, voltage and temperature variations.

In analog PLLs 900, the output of the PFD+CP 902 may produce an error signal 920 using a reference clock 912 and a phase-corrected output signal 918, but the error signal 920 may not be digital. Therefore, an analog to digital converter (ADC) 980 may be used to convert the loop filter 904 output to a digital control word. In an analog PLL 900, the loop filter 904 may also have a big capacitor that acts like an integrator of the current coming out of the charge pump 902. A differentiator 982 may be used to reverse this integration, i.e., to perform differentiation to extract the data. Alternatively, differentiation may be performed in the analog domain, e.g., before the ADC 980.

Following the ADC 980 and the differentiator 982, the LMS algorithm may proceed similarly to that illustrated in FIG. 8. Specifically, the (now digital) error signal 920 may also be multiplied by the digital accumulated division ratio error (A(n)) 960. This product may be accumulated again (e.g., by the accumulator 978) to produce the gain normalization factor (k) 956 that is used to account for imprecision in the delay elements in the digital to time converter 910. The digital to time converter 910 (e.g., using the control signals from a dynamic element matcher (not shown)) may delay the divided output signal 916 to produce a phase-corrected output signal 918.

Figure 10:
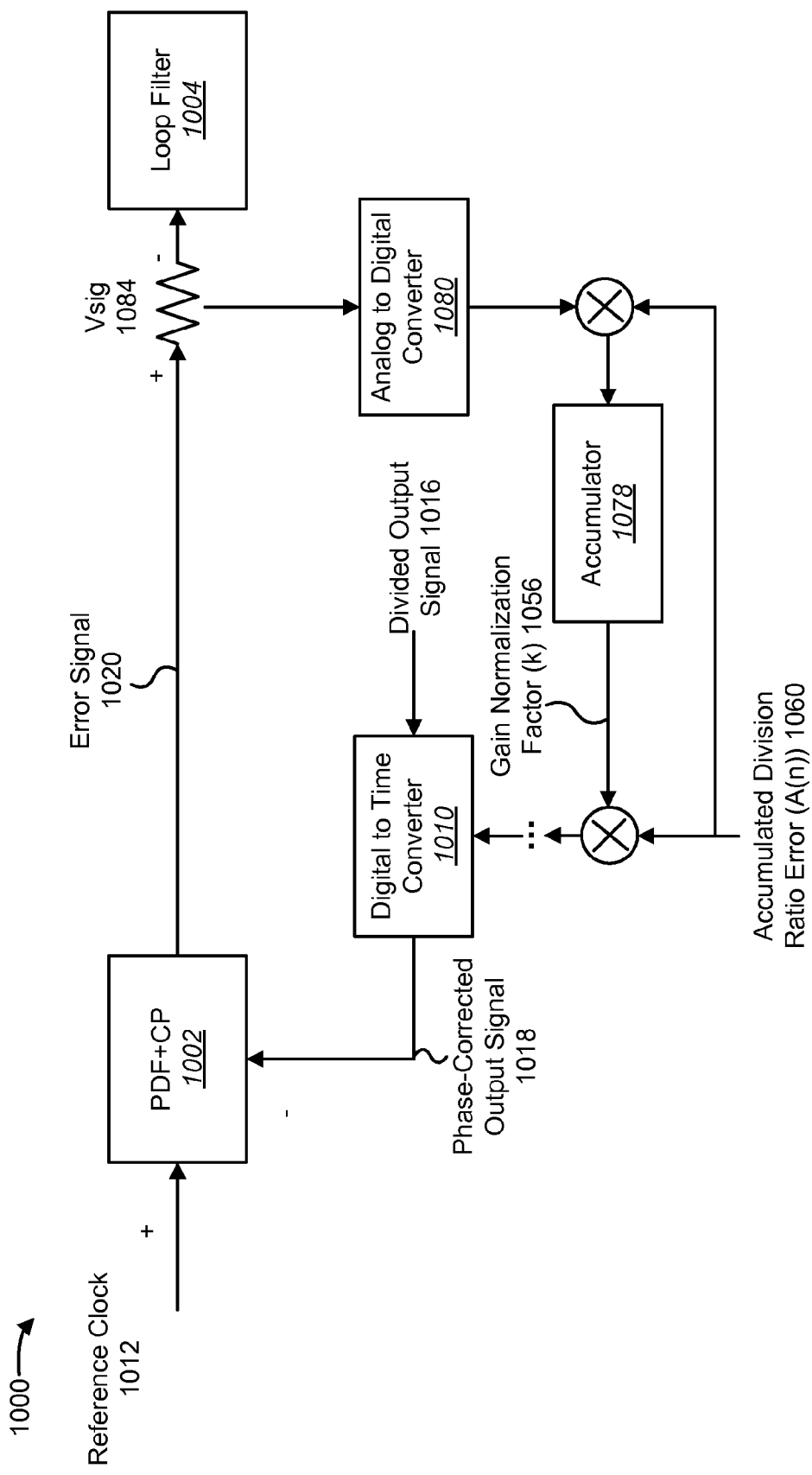
FIG. 10 is a block diagram illustrating another configuration of digital to time converter calibration in an analog locked loop (PLL)

FIG. 10 is a block diagram illustrating another configuration of digital to time converter 1010 calibration in an analog locked loop (PLL) 1000. The analog PLL 1000 may again use a least mean square (LMS) adaptive algorithm to dynamically calibrate the gain normalization factor (k) 1056.

In the analog PLL 1000, the PFD+CP 1002 may again produce an error signal 1020 using a reference clock 1012 and a phase-corrected output signal 1018. However, in the illustrated configuration, the analog to digital converter (ADC) 1080 input may be taken before the loop filter 1004. Since the error signal 1020 does not travel through the loop filter 1004 before being used in the LMS algorithm, it is not integrated. Therefore, the differentiator 982 illustrated in FIG. 9 may not be used in the PLL 1000 illustrated in FIG. 10. For example, the ADC input 1080 may be taken across a resistor before the loop filter, i.e., Vsig 1084.

Following the ADC 1080, the LMS algorithm may proceed similarly to that illustrated in FIG. 8. Specifically, The (now digital) error signal 1020 may also be multiplied by the digital accumulated division ratio error (A(n)) 1060. This product may be accumulated again (e.g., by the accumulator 1078) to produce the gain normalization factor (k) 1056 that is used to account for imprecision in the delay elements in the digital to time converter 1010. The digital to time converter 1010 (e.g., using the control signals from a dynamic element matcher (not shown)) may delay the divided output signal 1016 to produce a phase-corrected output signal 1018.

Figure 11:
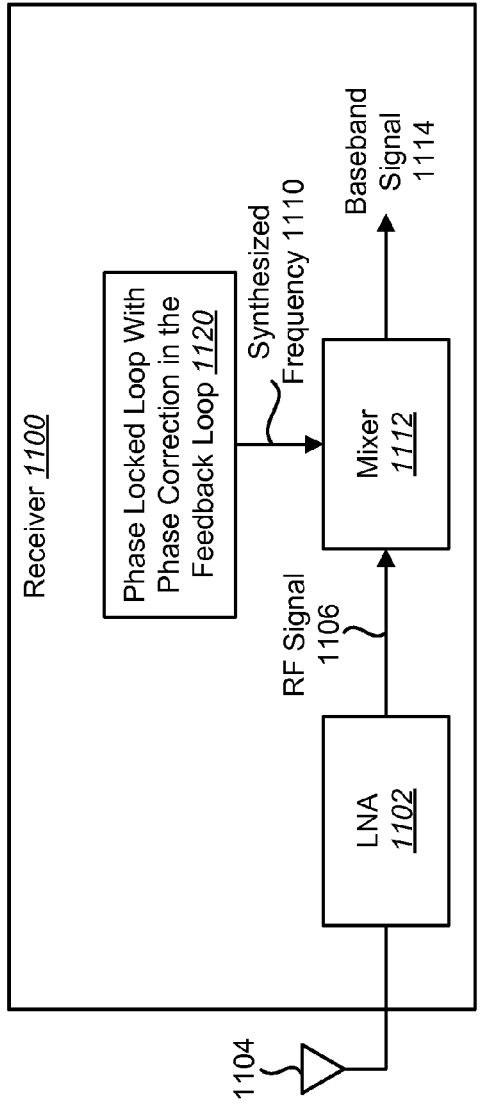
FIG. 11 is a block diagram illustrating a receiver.

FIG. 11 is a block diagram illustrating a receiver 1100. The receiver 1100 may be part of a mobile device or base station designed for wireless communication. The receiver 1100 may include, among other things, a low noise amplifier (LNA) 1102, a phase locked loop (PLL) using phase correction in the feedback loop 1120 and a mixer 1112. The LNA 1102 may receive a wireless communication signal from an antenna 1104. The LNA 1102 may amplify the received signal to usable levels and produce a radio frequency (RF) signal 1106, i.e., a representation of the original signal sent. The PLL using phase correction in the feedback loop 1120 may output a synthesized frequency 1110 directed to a particular application. The PLL using phase correction in the feedback loop 1120 may be capable of producing different frequencies. Although illustrated in the receiver 1100, the PLL using phase correction in the feedback loop 1120 may be used in various applications in a mobile device or base station designed for wireless communication. The mixer 1112 may receive the RF signal 1106 from the LNA 1102 and the synthesized frequency 1110 from the PLL using phase correction in the feedback loop 1120 and produce a baseband signal 1114. The baseband signal 1114 may be the actual reconstructed audio received by a microphone on a transmitting device, e.g., voiced speech or other kinds of data. Thus, the receiver 1100 may use the mixer 1112 to reconstruct the baseband signal 1114.

Figure 12:
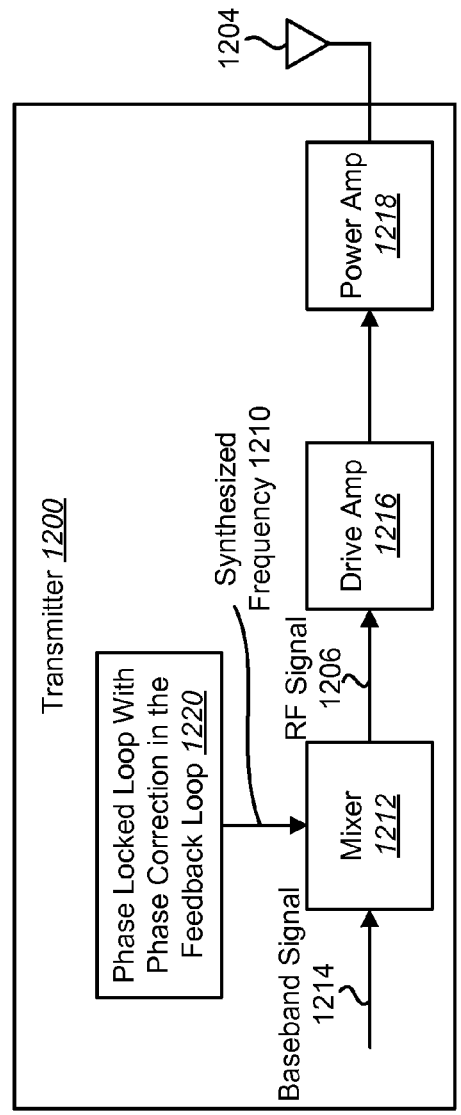
FIG. 12 is a block diagram illustrating a transmitter.

FIG. 12 is a block diagram illustrating a transmitter 1200. The transmitter 1200 may be part of a wireless device that may also include the receiver 1100 illustrated in FIG. 11. The transmitter 1200 may include, among other things, a PLL using phase correction in the feedback loop 1220, a mixer 1212, a drive amplifier 1216 and a power amplifier 1218. Like before, the PLL using phase correction in the feedback loop 1220 produce the synthesized frequency 1210. The mixer 1212 may receive the synthesized frequency 1210 and a baseband signal 1214 (e.g., voiced speech), and produce an RF signal 1206. In other words, the transmitter 1200 may use the mixer 1212 to produce a modulated, high frequency RF signal 1206 to be transmitted. Before the RF signal 1206 is transmitted via an antenna 1204, it may be amplified by a drive amplifier 1216, a power amplifier 1218 or both. Thus, the transmitter 1200 may use the mixer 1212 to construct an RF signal 1206 for transmission.

Figure 13:
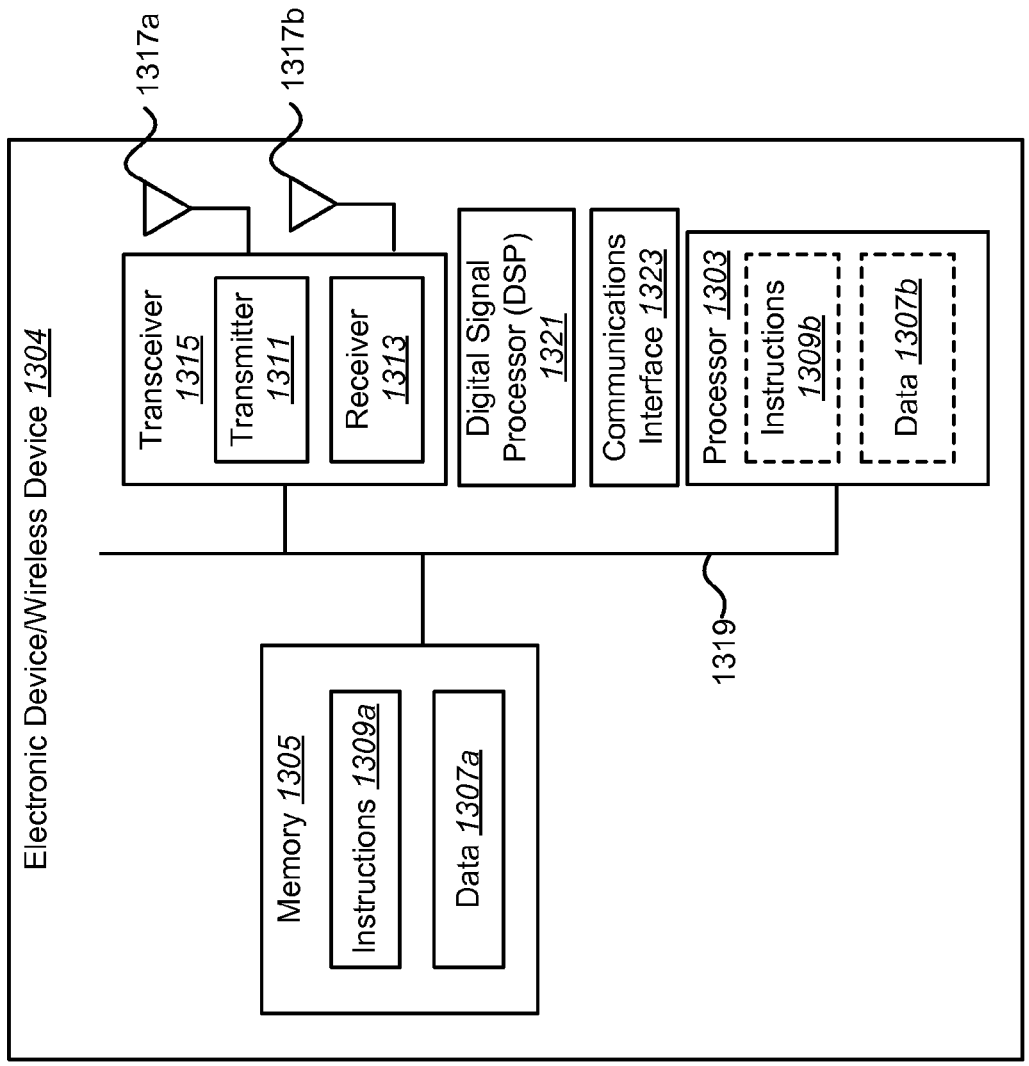
FIG. 13 illustrates certain components that may be included within an electronic device/wireless device.

FIG. 13 illustrates certain components that may be included within an electronic device/wireless device 1304. The electronic device/wireless device 1304 may be an access terminal, a mobile station, a user equipment (UE), a base station, an access point, a broadcast transmitter, a node B, an evolved node B, etc. For example, the electronic device/wireless device 1304 may include the receiver 1100 or transmitter 1200 illustrated in FIGS. 11 and 12, respectively. The electronic device/wireless device 1304 includes a processor 1303. The processor 1303 may be a general purpose single- or multi-chip microprocessor (e.g., an ARM), a special purpose microprocessor (e.g., a digital signal processor (DSP)), a microcontroller, a programmable gate array, etc. The processor 1303 may be referred to as a central processing unit (CPU). Although just a single processor 1303 is shown in the electronic device/wireless device 1304 of FIG. 13, in an alternative configuration, a combination of processors (e.g., an ARM and DSP) could be used.

The electronic device/wireless device 1304 also includes memory 1305. The memory 1305 may be any electronic component capable of storing electronic information. The memory 1305 may be embodied as random access memory (RAM), read-only memory (ROM), magnetic disk storage media, optical storage media, flash memory devices in RAM, on-board memory included with the processor, EPROM memory, EEPROM memory, registers, and so forth, including combinations thereof.

Data 1307a and instructions 1309a may be stored in the memory 1305. The instructions 1309a may be executable by the processor 1303 to implement the methods disclosed herein. Executing the instructions 1309a may involve the use of the data 1307a that is stored in the memory 1305. When the processor 1303 executes the instructions 1309a, various portions of the instructions 1309b may be loaded onto the processor 1303, and various pieces of data 1307b may be loaded onto the processor 1303.

The electronic device/wireless device 1304 may also include a transmitter 1311 and a receiver 1313 to allow transmission and reception of signals to and from the electronic device/wireless device 1304. The transmitter 1311 and receiver 1313 may be collectively referred to as a transceiver 1315. Multiple antennas 1317a-b may be electrically coupled to the transceiver 1315. The electronic device/wireless device 1304 may also include (not shown) multiple transmitters, multiple receivers, multiple transceivers and/or additional antennas.

The electronic device/wireless device 1304 may include a digital signal processor (DSP) 1321. The electronic device/wireless device 1304 may also include a communications interface 1323. The communications interface 1323 may allow a user to interact with the electronic device/wireless device 1304.

The various components of the electronic device/wireless device 1304 may be coupled together by one or more buses, which may include a power bus, a control signal bus, a status signal bus, a data bus, etc. For the sake of clarity, the various buses are illustrated in FIG. 13 as a bus system 1319.

The term "coupled" encompasses a wide variety of connections. For example, the term "coupled" should be interpreted broadly to encompass circuit elements directly connected to each other and circuit elements indirectly connected via other circuit elements.

The term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The phrase "based on" does not mean "based only on," unless expressly specified otherwise. In other words, the phrase "based on" describes both "based only on" and "based at least on."

The term "processor" should be interpreted broadly to encompass a general purpose processor, a central processing unit (CPU), a microprocessor, a digital signal processor (DSP), a controller, a microcontroller, a state machine, and so forth. Under some circumstances, a "processor" may refer to an application specific integrated circuit (ASIC), a programmable logic device (PLD), a field programmable gate array (FPGA), etc. The term "processor" may refer to a combination of processing devices, e.g., a combination of a DSP and a microprocessor, a plurality of microprocessors, one or more microprocessors in conjunction with a DSP core, or any other such configuration.

The term "memory" should be interpreted broadly to encompass any electronic component capable of storing electronic information. The term memory may refer to various types of processor-readable media such as random access memory (RAM), read-only memory (ROM), non-volatile random access memory (NVRAM), programmable read-only memory (PROM), erasable programmable read only memory (EPROM), electrically erasable PROM (EEPROM), flash memory, magnetic or optical data storage, registers, etc. Memory is said to be in electronic communication with a processor if the processor can read information from and/or write information to the memory. Memory that is integral to a processor is in electronic communication with the processor.

The terms "instructions" and "code" should be interpreted broadly to include any type of computer-readable statement(s). For example, the terms "instructions" and "code" may refer to one or more programs, routines, sub-routines, functions, procedures, etc. "Instructions" and "code" may comprise a single computer-readable statement or many computer-readable statements.

The functions described herein may be implemented in software or firmware being executed by hardware. The functions may be stored as one or more instructions on a computer-readable medium. The terms "computer-readable medium" or "computer-program product" refers to any tangible storage medium that can be accessed by a computer or a processor. By way of example, and not limitation, a computer-readable medium may comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and Blu-ray® disc where disks usually reproduce data magnetically, while discs reproduce data optically with lasers.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

Further, it should be appreciated that modules and/or other appropriate means for performing the methods and techniques described herein, such as those illustrated by FIG. 3, can be downloaded and/or otherwise obtained by a device. For example, a device may be coupled to a server to facilitate the transfer of means for performing the methods described herein. Alternatively, various methods described herein can be provided via a storage means (e.g., random access memory (RAM), read only memory (ROM), a physical storage medium such as a compact disc (CD) or floppy disk, etc.), such that a device may obtain the various methods upon coupling or providing the storage means to the device.

It is to be understood that the claims are not limited to the precise configuration and components illustrated above. Various modifications, changes and variations may be made in the arrangement, operation and details of the systems, methods, and apparatus described herein without departing from the scope of the claims.

What is claimed is:

1. A frequency synthesizer circuit, comprising:
    a comparator circuit coupled to a reference clock and a phase-corrected output signal;
    a loop filter coupled to the comparator circuit;
    an oscillator coupled to the loop filter;
    a fractional divider coupled to an output of the oscillator; and
    phase correction circuitry that corrects a phase of an output of the fractional divider to produce the phase-corrected output signal.

2. The frequency synthesizer circuit of claim 1, wherein the fractional divider alternates between dividing an output frequency of the oscillator by a first divide ratio and a second divide ratio.

3. The frequency synthesizer circuit of claim 2, wherein the fractional divider comprises a delta sigma modulator that randomizes selection of each divide ratio used by the fractional divider while maintaining a desired time-average ratio between the divide ratios.

4. The frequency synthesizer circuit of claim 1, wherein the comparator is configured to produce an error signal that indicates a difference in phase of the reference clock and the phase-corrected output signal.

5. The frequency synthesizer circuit of claim 1, wherein the phase correction circuitry corrects the phase of the output of the fractional divider by delaying the phase of the output of the fractional divider so a phase difference between the reference clock and phase-corrected output signal is stable over time.

6. The frequency synthesizer circuit of claim 1, wherein the phase correction circuitry comprises multiple delay elements, each comprising at least one inverter circuit with an adjustable delay.

7. The frequency synthesizer circuit of claim 1, wherein the phase correction circuitry receives one or more control signals from digital delay control circuitry.

8. The frequency synthesizer circuit of claim 7, wherein the digital delay control circuitry comprises:
    a first delta sigma modulator that receives a time-average fractional divide ratio and outputs an instantaneous integer divide ratio;
    a first accumulator that accumulates the difference between the time-average fractional divide ratio and the instantaneous integer divide ratio to produce an accumulated division ratio error;
    a digital multiplier that scales the accumulated division ratio error by a gain normalization factor;
    a digital adder that adds an offset to the gain-normalized ratio error;
    a second delta sigma modulator that truncates the offset ratio error; and
    a dynamic element matcher that, based on the truncated ratio error, produces the control signals to alternate delay elements used in the phase correction circuitry.

9. The frequency synthesizer circuit of claim 8, wherein the digital delay control circuitry further comprises gain normalization factor calibration circuitry, comprising:
    a second accumulator that accumulates a product of the accumulated division ratio error and an output of the comparator circuit to produce the gain normalization factor.

10. An integrated circuit for correcting the phase error in the feedback loop of a phase locked loop (PLL), comprising:
    a comparator circuit coupled to a reference clock and a phase-corrected output signal;
    a loop filter coupled to the comparator circuit;
    an oscillator coupled to the loop filter;
    a fractional divider coupled to an output of the oscillator; and
    phase correction circuitry that corrects a phase of an output of the fractional divider to produce the phase-corrected output signal.

11. The integrated circuit of claim 10, wherein the fractional divider alternates between dividing an output frequency of the oscillator by a first divide ratio and a second divide ratio.

12. The integrated circuit of claim 11, wherein the fractional divider comprises a delta sigma modulator that randomizes selection of each divide ratio used by the fractional divider while maintaining a desired time-average ratio between the divide ratios.

13. The integrated circuit of claim 10, wherein the comparator is configured to produce an error signal that indicates a difference in phase of the reference clock and the phase-corrected output signal.

14. The integrated circuit of claim 10, wherein the phase correction circuitry corrects the phase of the output of the fractional divider by delaying the phase of the output of the fractional divider so a phase difference between the reference clock and phase-corrected output signal is stable over time.

15. The integrated circuit of claim 10, wherein the phase correction circuitry comprises multiple delay elements, each comprising at least one inverter circuit with an adjustable delay.

16. The integrated circuit of claim 10, wherein the phase correction circuitry receives one or more control signals from digital delay control circuitry.

17. The integrated circuit of claim 16, wherein the digital delay control circuitry comprises:
    a first delta sigma modulator that receives a time-average fractional divide ratio and outputs an instantaneous integer divide ratio;
    a first accumulator that accumulates the difference between the time-average fractional divide ratio and the instantaneous integer divide ratio to produce am accumulated division ratio error;
    a digital multiplier that scales the accumulated division ratio error by a gain normalization factor;
    a digital adder that adds an offset to the gain-normalized ratio error;
    a second delta sigma modulator that truncates the offset ratio error; and
    a dynamic element matcher that, based on the truncated ratio error, produces the control signals to alternate delay elements used in the phase correction circuitry.

18. The integrated circuit of claim 17, wherein the digital delay control circuitry further comprises gain normalization factor calibration circuitry, comprising:

a second accumulator that accumulates a product of the accumulated division ratio error and an output of the comparator circuit to produce the gain normalization factor.

19. A method for correcting the phase error in the feedback loop of a phase locked loop (PLL), comprising:
comparing a phase-corrected output signal with a reference clock to produce an error signal;
filtering the error signal;
creating an oscillator output with a frequency based on the filtered error signal;
selecting an integer divide ratio to achieve a time-average fractional divide ratio;
dividing the frequency of the oscillator output by the selected integer divide ratio; and
adjusting a phase of the divided oscillator output to produce the phase-corrected oscillator output.

20. The method of claim 19, wherein the dividing comprises alternating between dividing the frequency of the oscillator output by a first divide factor and a second divide ratio.

21. The method of claim 19, wherein the error signal indicates a difference in phase of the reference clock and the phase-corrected output signal.

22. The method of claim 19, wherein the adjusting comprises correcting the phase of the divided oscillator output by delaying the phase of the divided oscillator output so a phase difference between the reference clock and phase-corrected output signal is stable over time.

23. The method of claim 19, wherein the adjusting comprises using multiple delay elements, each comprising at least one inverter circuit with an adjustable delay.

24. The method of claim 19, wherein the adjusting is based on one or more received control signals.

25. The method of claim 24, further comprising determining the control signals, comprising:
outputting an instantaneous integer divide ratio based on a received time-average fractional divide ratio;
accumulating a difference between the time-average fractional divide ratio and the instantaneous integer divide ratio to produce an accumulated division ratio error;
scaling the accumulated division ratio error by a gain normalization factor;
adding an offset to the gain-normalized ratio error;
truncating the offset ratio error; and
producing, based on the truncated ratio error, the control signals to alternate delay elements used in the phase correction circuitry.

26. The method of claim 25, further comprising calibrating the gain normalization factor by accumulating a product of the accumulated division ratio error and the error signal to produce the gain normalization factor.

27. A frequency synthesizer for correcting the phase error in the feedback loop of a phase locked loop (PLL), comprising:
means for comparing a phase-corrected output signal with a reference clock to produce an error signal;
means for filtering the error signal;
means for creating an oscillator output with a frequency based on the filtered error signal;
means for selecting an integer divide ratio to achieve a time-average fractional divide ratio;
means for dividing the frequency of the oscillator output by the selected integer divide ratio; and
means for adjusting a phase of the divided oscillator output to produce the phase-corrected oscillator output.

28. The frequency synthesizer of claim 27, wherein the means for dividing comprise means for alternating between dividing the frequency of the oscillator output by a first divide factor and a second divide ratio.

29. The frequency synthesizer of claim 27, wherein the error signal indicates a difference in phase of the reference clock and the phase-corrected output signal.

30. The frequency synthesizer of claim 27, wherein the means for adjusting comprise means for correcting the phase of the divided oscillator output by delaying the phase of the divided oscillator output so a phase difference between the reference clock and phase-corrected output signal is stable over time.

31. The frequency synthesizer of claim 27, wherein the means for adjusting comprise means for using multiple delay elements, each comprising at least one inverter circuit with an adjustable delay.

32. The frequency synthesizer of claim 27, wherein the means for adjusting uses one or more received control signals.

33. The frequency synthesizer of claim 32, further comprising means for determining the control signals, comprising:
means for outputting an instantaneous integer divide ratio based on a received time-average fractional divide ratio;
means for accumulating a difference between the time-average fractional divide ratio and the instantaneous integer divide ratio to produce an accumulated division ratio error;
means for scaling the accumulated division ratio error by a gain normalization factor;
means for adding an offset to the gain-normalized ratio error;
means for truncating the offset ratio error; and
means for producing, based on the truncated ratio error, the control signals to alternate delay elements used in the phase correction circuitry.

34. The frequency synthesizer of claim 33, further comprising means for calibrating the gain normalization factor by accumulating a product of the accumulated division ratio error and the error signal to produce the gain normalization factor.

* * * * *